(12) United States Patent
Sung et al.

(10) Patent No.: US 12,170,269 B2
(45) Date of Patent: Dec. 17, 2024

(54) DISPLAY DEVICE AND METHOD OF MANUFACTURING DISPLAY DEVICE

(71) Applicant: Samsung Display Co., LTD., Yongin-si (KR)

(72) Inventors: Hyunah Sung, Suwon-si (KR); Gyungmin Baek, Yongin-si (KR); Hyuneok Shin, Gwacheon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 530 days.

(21) Appl. No.: 17/494,260

(22) Filed: Oct. 5, 2021

(65) Prior Publication Data

US 2022/0199852 A1    Jun. 23, 2022

(30) Foreign Application Priority Data

Dec. 18, 2020   (KR) ........................ 10-2020-0179047

(51) Int. Cl.
| | |
|---|---|
| *H01L 25/075* | (2006.01) |
| *H01L 25/16* | (2023.01) |
| *H01L 33/62* | (2010.01) |
| H01L 33/00 | (2010.01) |

(52) U.S. Cl.
CPC ........ *H01L 25/0753* (2013.01); *H01L 25/167* (2013.01); *H01L 33/005* (2013.01); *H01L 33/62* (2013.01)

(58) Field of Classification Search
CPC .... H10L 25/0753; H01L 33/005–0095; H10K 59/1201
See application file for complete search history.

(56) References Cited

U.S. PATENT DOCUMENTS

2014/0319496 A1\* 10/2014 Kim ..................... H10K 77/111
257/40
2020/0127073 A1   4/2020 Ke et al.

FOREIGN PATENT DOCUMENTS

| KR | 10-2016-0125584 | 11/2016 |
|---|---|---|
| KR | 10-2019-0048642 | 5/2019 |
| KR | 10-2049735 | 11/2019 |

\* cited by examiner

*Primary Examiner* — Daniel P Shook
(74) *Attorney, Agent, or Firm* — Lewis Roca Rothgerber Christie LLP

(57) ABSTRACT

A display device and a method of manufacturing a display device are provided. A method of manufacturing a display device may include: forming a sacrificial layer on a carrier glass; forming a first substrate layer on the sacrificial layer, the first substrate layer including an organic insulation material; forming a first through-hole in the first substrate layer, the first through-hole passing through the first substrate layer; forming a wiring on an upper surface of the first substrate layer, the wiring extending into the first through-hole; sequentially forming a circuit layer, an emission layer, and an encapsulation layer on the wiring; separating the sacrificial layer and the carrier glass from the first substrate layer by irradiating the sacrificial layer with a laser; and attaching a driving element on a lower surface of the first substrate layer, the driving element being electrically connected to the wiring through the first through-hole.

12 Claims, 12 Drawing Sheets

DISPLAY DEVICE AND METHOD OF MANUFACTURING DISPLAY DEVICE

CROSS-REFERENCE TO RELATED APPLICATION

This application claims priority to and the benefit of Korean Patent Application No. 10-2020-0179047 filed on Dec. 18, 2020 in the Korean Intellectual Property Office (KIPO), the entire disclosure of which is incorporated by reference herein.

BACKGROUND

1. Field

Aspects of embodiments relate to a display device and a method of manufacturing the same.

2. Description of the Related Art

In general, a tiled display device may include a plurality of display panels to implement a large screen. In this case, a bezel may be positioned at a boundary between the display panels, and the bezel may be visually recognized by a user, such that display quality of the tiled display device may be deteriorated.

SUMMARY

According to an aspect of embodiments, a tiled display device and a method of manufacturing the same are provided. According to another aspect of embodiments, a method of manufacturing a display device is provided in which a manufacturing cost is decreased and a risk of damage to the display device is reduced.

According to another aspect of embodiments, a display device in which a dead space is decreased is provided.

A method of manufacturing a display device according to one or more embodiments may include: forming a sacrificial layer on a carrier glass; forming a first substrate layer on the sacrificial layer, the first substrate layer including an organic insulation material; forming a first through-hole in the first substrate layer, the first through-hole passing through the first substrate layer; forming a wiring on an upper surface of the first substrate layer, the wiring extending into the first through-hole; sequentially forming a circuit layer, an emission layer, and an encapsulation layer on the wiring; separating the sacrificial layer and the carrier glass from the first substrate layer by irradiating the sacrificial layer with a laser; and attaching a driving element on a lower surface of the first substrate layer, the driving element being electrically connected to the wiring through the first through-hole.

In an embodiment, the sacrificial layer may include at least one of titanium (Ti), molybdenum (Mo), and molybdenum oxide ($MoO_2$).

In an embodiment, an absorption rate of the sacrificial layer with respect to the laser may be about 25% or more.

In an embodiment, a melting point of the sacrificial layer may be about 3,000 degrees Celsius or less.

In an embodiment, a thickness of the sacrificial layer may be about 300 Å or more and about 1,000 Å or less.

In an embodiment, the first through-hole may be formed by an etching process.

In an embodiment, the method may further include, after forming the wiring and before sequentially forming the circuit layer, the emission layer, and the encapsulation layer, forming a second substrate layer on the first substrate layer, the second substrate layer covering the wiring and including a same material as the first substrate layer.

In an embodiment, the circuit layer may include a pad. The pad may contact the wiring through a second through-hole formed in the second substrate layer.

In an embodiment, the method may further include, after forming the first substrate layer and before forming the first through-hole, forming a barrier layer on the first substrate layer, the barrier layer including an inorganic insulation material.

In an embodiment, the method may further include, after forming the wiring and before forming the second substrate layer, forming a barrier layer on the first substrate layer, the barrier layer covering the wiring and including an inorganic insulation material.

In an embodiment, the laser may be emitted under the carrier glass.

A display device according to one or more embodiments may include: a first substrate layer including an organic insulation material; a wiring disposed on an upper surface of the first substrate layer; a circuit layer disposed on the wiring; an emission layer disposed on the circuit layer; an encapsulation layer disposed on the emission layer; a residual pattern disposed on a lower surface of the first substrate layer, the residual pattern including at least one of titanium (Ti), molybdenum (Mo), and molybdenum oxide ($MoO_2$); and a driving element disposed on the lower surface of the first substrate layer, the driving element being electrically connected to the wiring through a first through-hole formed in the first substrate layer.

In an embodiment, an absorption rate of the residual pattern with respect to a laser may be about 25% or more.

In an embodiment, a melting point of the residual pattern may be about 3,000 degrees Celsius or less.

In an embodiment, the display device may further include a second substrate layer disposed between the wiring and the circuit layer, the second substrate layer including a same material as the first substrate layer.

In an embodiment, the circuit layer may include a pad. The pad may contact the wiring through a second through-hole formed in the second substrate layer.

In an embodiment, the circuit layer may include a semiconductor layer disposed on the second substrate layer, a scan line disposed on the semiconductor layer, an initialization voltage line disposed on the scan line, and a data line disposed on the initialization voltage line. The pad may be disposed on the same layer as one of the scan line, the initialization voltage line, and the data line.

In an embodiment, the display device may further include a barrier layer disposed between the first substrate layer and the wiring or between the wiring and the second substrate layer, the barrier layer including an inorganic insulation material.

In an embodiment, the emission layer may include an inorganic light emitting diode.

In an embodiment, the driving element may include at least one of a flexible printed circuit board and an integrated circuit chip.

In a method of manufacturing the display device according to one or more embodiments, the wiring may be formed on the upper surface of the first substrate layer before separating the sacrificial layer and the carrier glass from the lower surface of the first substrate layer, such that a protective glass for protecting the encapsulation layer may not be required. Accordingly, a manufacturing cost of the display device may be decreased, and the display device may be manufactured without damaging the display device due to static electricity that may be generated in the process of removing the protective glass.

In the display device according to one or more embodiments, the wiring disposed on the upper surface of the first substrate layer may be electrically connected to the driving element disposed on the lower surface of the first substrate layer, such that a dead space of the display device may decrease.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
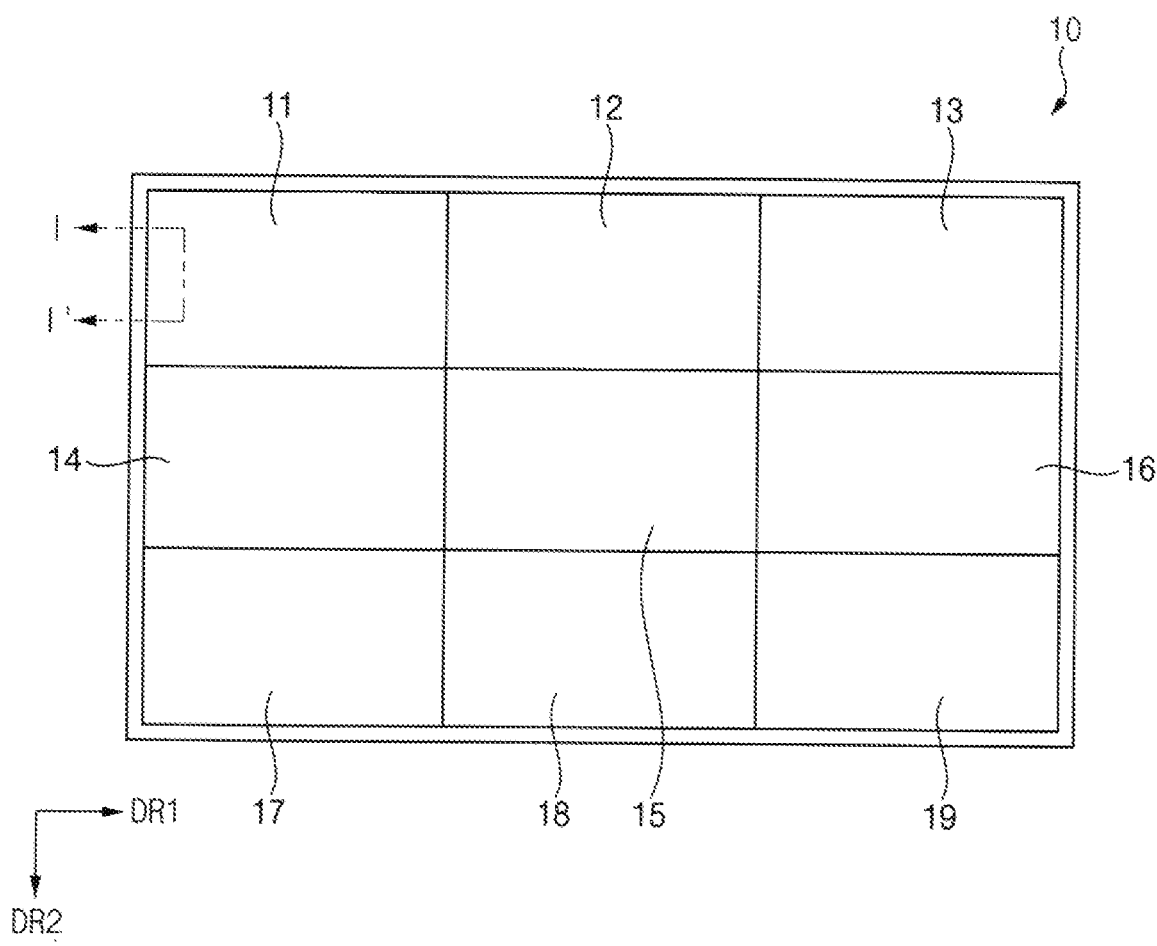
FIG. 1 is a plan view illustrating a display device according to an embodiment.

Herein, display devices and methods of manufacturing display devices in accordance with embodiments will be explained in further detail with reference to the accompanying drawings. Where possible, same or similar reference numerals are used in the drawings and the description to refer to the same or like parts. The drawings may not be to precise scale. As used herein, the term "and/or" includes any and all combinations of one or more of the associated listed items. Expressions such as "at least one of," when preceding a list of elements, modify the entire list of elements and do not modify the individual elements of the list.

It is to be understood that although terms such as "first" and "second" may be used herein to describe various components, these components are not limited by these terms, and the terms are used to distinguish one component from another.

As used herein, the singular forms "a," "an," and "the" are intended to include the plural forms as well, unless the context clearly indicates otherwise.

It is to be further understood that the terms "comprises" and/or "comprising" used herein specify the presence of stated features or components, but do not preclude the presence or addition of one or more other features or components.

It is to be understood that when a layer, area, or component is referred to as being "formed on" another layer, area, or component, it may be directly or indirectly formed on the other layer, area, or component. That is, for example, one or more intervening layers, areas, or components may be present.

When an embodiment may be implemented differently, a specific process order may be performed differently from the described order. For example, two consecutively described processes may be performed substantially at the same time or performed in an order opposite to the described order.

In embodiments set forth herein, when a layer, area, or component is connected to another layer, area, or component, the layers, areas, or components may be directly connected to each other, and the layers, areas, or components may also be indirectly connected to each other with another layer, area, or component therebetween.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a plan view illustrating a display device according to an embodiment.

Referring to FIG. 1, a display device 10 may include a plurality of display panels. Each of the display panels may display an image. In other words, the display device 10 may be a tiled display device that displays an image through a plurality of display panels. The display panels may be arranged along a first direction DR1 and a second direction DR2 crossing the first direction DR1.

In an embodiment, the display device 10 may include first to ninth display panels 11 to 19. For example, as illustrated in FIG. 1, the first to ninth display panels 11 to 19 may be arranged as three rows and three columns in a plan view. However, the present invention is not limited thereto, and, in other embodiments, the display device 10 may include two to eight or ten or more display panels.

Figure 2:
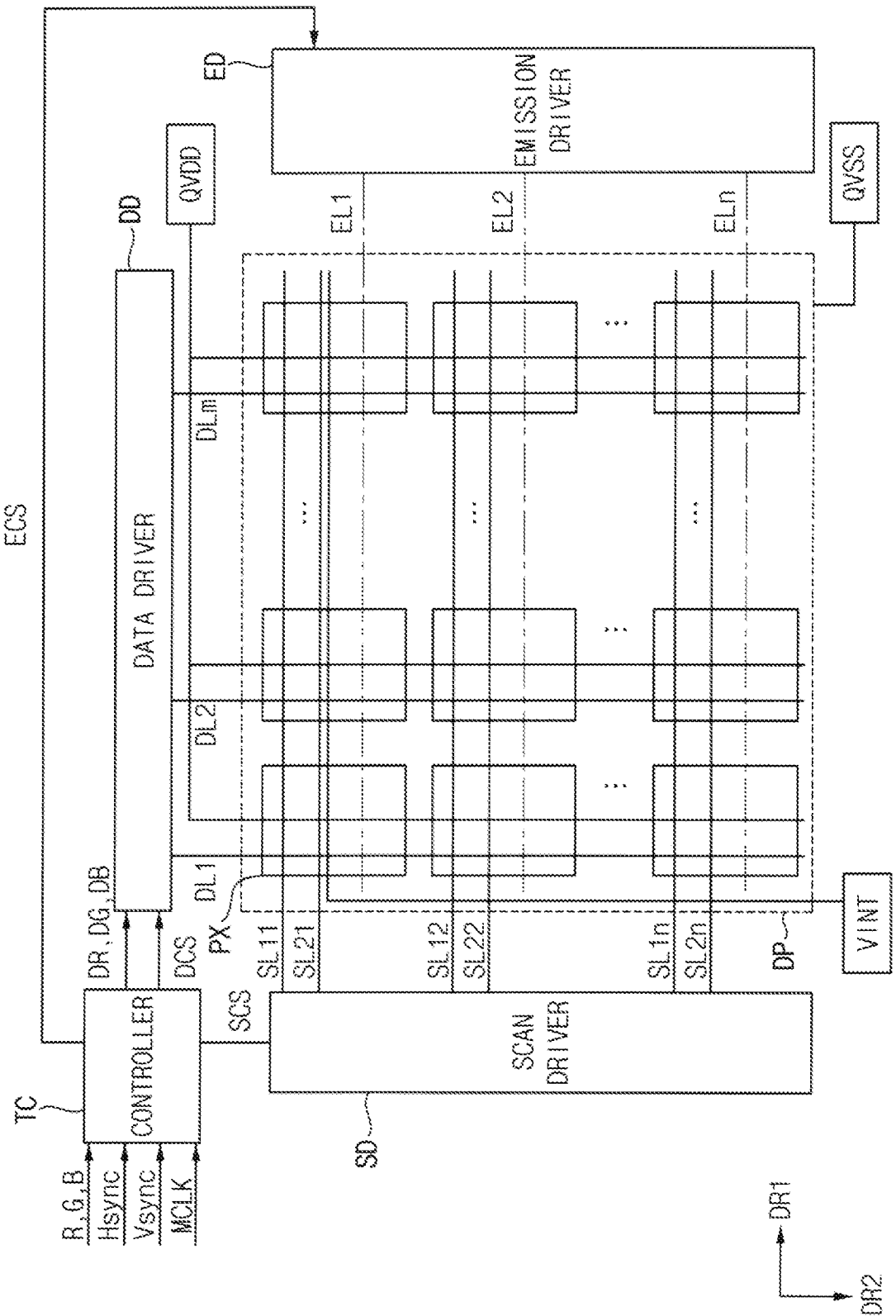
FIG. 2 is a block diagram illustrating a display panel according to an embodiment.

FIG. 2 is a block diagram illustrating a display panel according to an embodiment. For example, FIG. 2 may illustrate the first display panel 11 in FIG. 1.

Referring to FIG. 2, the display panel 11 may include a display (display portion, display unit) DP, a scan driver SD, a data driver DD, an emission control driver ED, and a timing controller TC.

The display DP may include a plurality of pixels PX, a plurality of scan lines SL11 to SL1n and SL21 to SL2n, where n is an integer greater than or equal to 2, and a plurality of data lines DL1 to DLm, where m is an integer greater than or equal to 2, and a plurality of emission control lines EL1 to ELn. The pixels PX may be disposed in crossing regions of the scan lines SL11 to SL1n and SL21 to SL2n, the data lines DL1 to DLm, and the emission control lines EL1 to ELn. Here, the pixel PX may be a minimum unit for displaying an image or color.

The scan lines SL11 to SL1n and SL21 to SL2n may generally extend in the first direction DR1 (or a row direction). The emission control lines EL1 to ELn may generally extend in the first direction DR1. The data lines DL1 to DLm may generally extend in the second direction DR2 (or a column direction).

The display DP may further include an initialization voltage line, a first power voltage line, and a second power voltage line. The initialization voltage line may supply an initialization voltage VINT to the pixels PX. The first power voltage line may supply a first power voltage QVDD to the pixels PX. The second power voltage line may supply a second power voltage QVSS different from the first power voltage QVDD to the pixels PX.

In an embodiment, each of the pixels PX may be connected to two scan lines, one data line, one emission control line, one initialization voltage line, and one first power voltage line. For example, the pixel PX positioned in a first pixel row and a first pixel column may be connected to first-first and second-first scan lines SL11 and SL21, a first data line DL1, a first emission control line EL1, one initialization voltage line, and one first power voltage line.

The scan driver SD may generate first and second scan signals, and may provide the first and second scan signals to the pixels PX through the scan lines SL11 to SL1n and SL21 to SL2n.

The data driver DD may generate a data signal, and may provide the data signal to the pixels PX through the data lines DL1 to DLm.

The emission control driver ED may generate an emission control signal, and may provide the emission control signal to the pixels PX through the emission control lines EL1 to ELn. The emission control driver ED may control an emission time of each of the pixels PX based on the emission control signal. FIG. 2 illustrates that the emission control driver ED is implemented separately from the scan driver SD; however, the present invention is not limited thereto. For example, the emission control driver ED may be included in the scan driver SD, and may be implemented integrally with the scan driver SD.

The timing controller TC may convert image signals R, G, and B transmitted from the outside into image data signals DR, DG, and DB, and may transmit the image data signals DR, DG, and DB to the data driver DD. Further, the timing controller TC may receive a horizontal synchronization signal Hsync, a vertical synchronization signal Vsync, and a clock signal MCLK, may generate control signals for controlling operations of the scan driver SD, the data driver DD, and the emission control driver ED, and may provide the control signals to the scan driver SD, the data driver DD, and the emission control driver ED. Here, the control signals may include a scan driving control signal SCS for controlling the scan driver SD, a data driving control signal DCS for controlling the data driver DD, and an emission driving control signal ECS for controlling the emission control driver ED.

The display panel 11 may further include a power supply. The power supply may generate the first power voltage QVDD, the second power voltage QVSS, and the initialization voltage VINT, and may provide the first power voltage QVDD, the second power voltage QVSS, and the initialization voltage VINT to the pixels PX through the first power voltage line, the second power voltage line, and the initialization voltage line, respectively. In an embodiment, the first power voltage QVDD may be a high level voltage (e.g., a predetermined high level voltage), the second power voltage QVSS may be a low level voltage (e.g., a predetermined low level voltage), and a voltage level of the second power voltage QVSS may be lower than a voltage level of the first power voltage QVDD.

Each of the pixels PX may emit light having a luminance (e.g., a predetermined luminance) based on a driving current supplied to a light emitting element according to the data signal transmitted through the data lines DL1 to DLm.

Figure 3:
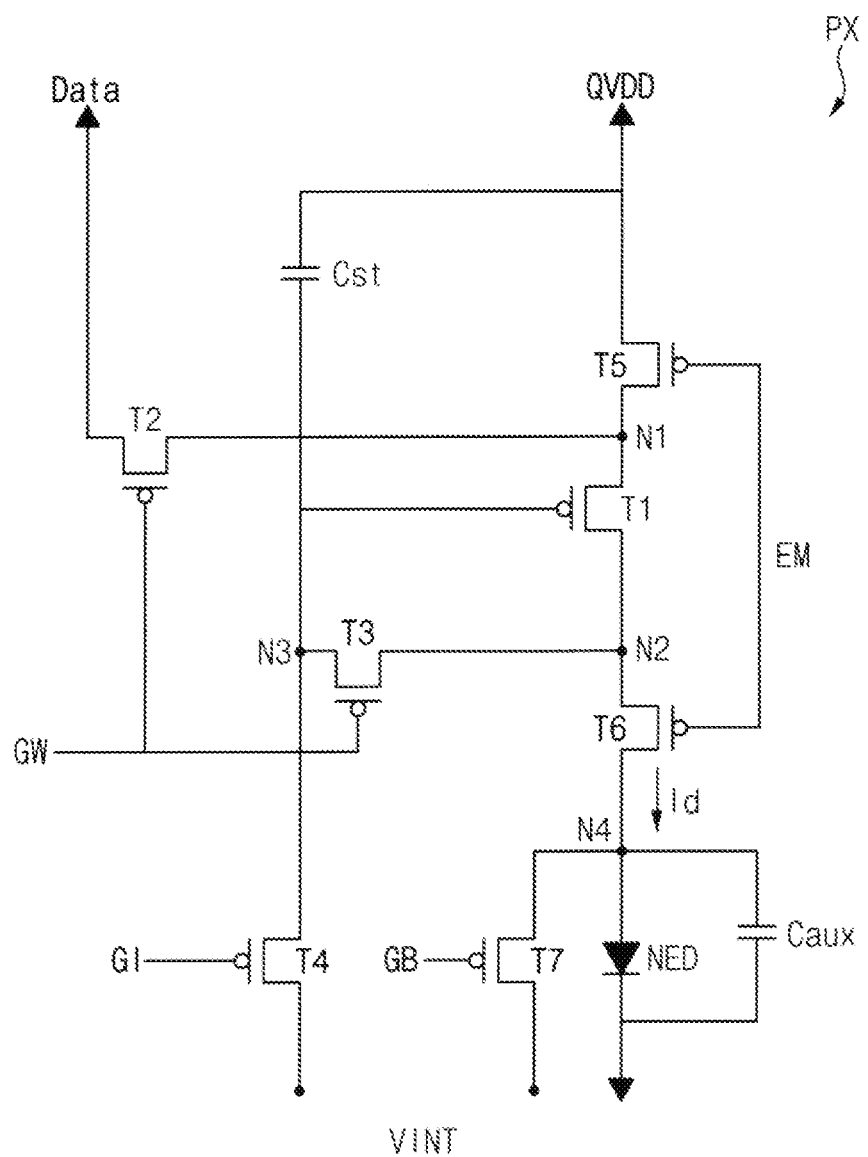
FIG. 3 is a circuit diagram illustrating a pixel according to an embodiment.

FIG. 3 is a circuit diagram illustrating a pixel according to an embodiment. For example, FIG. 3 may illustrate one pixel PX in FIG. 2.

Referring to FIG. 3, the pixel PX may include a light emitting element NED, first to seventh transistors T1 to T7, a capacitor Cst, and an auxiliary capacitor Caux. In an embodiment, the light emitting element NED may be an inorganic light emitting element.

A data signal Data, a first scan signal GW, a second scan signal GI, a third scan signal GB, and an emission control signal EM may be provided to the pixel PX. Here, the second scan signal GI may be the same as the first scan signal GW of a previous time period or a previous row. For example, the second scan signal GI[n] provided to the pixel PX in an n-th row may be the same as the first scan signal GW[n−1] provided to the pixel PX in an (n−1)-th row. The third scan signal GB may be the same as the second scan signal GI of a next time period or a next row. For example, the third scan signal GB[n] provided to the pixel PX in the n-th row may be the same as the second scan signal GI[n+1] provided to the pixel PX in an (n+1)-th row.

Each of the first to seventh transistors T1 to T7 may include a first electrode, a second electrode, and a gate electrode. One of the first electrode and the second electrode may be a source electrode, and another one of the first electrode and the second electrode may be a drain electrode.

In an embodiment, each of the first to seventh transistors T1 to T7 may be a thin film transistor. Further, each of the first to seventh transistors T1 to T7 may be a PMOS transistor or an NMOS transistor. Herein, it will be described, as an example, that each of the first to seventh transistors T1 to T7 is the PMOS transistor.

The light emitting element NED may include a first pixel electrode and a second pixel electrode. The first pixel electrode of the light emitting element NED may be connected to a fourth node N4, and the second pixel electrode of the light emitting element NED may be connected to the second power voltage line.

The auxiliary capacitor Caux may be connected to the light emitting element NED in parallel. For example, the auxiliary capacitor Caux may include a first electrode and a second electrode, the first electrode may be electrically connected to the first pixel electrode of the light emitting element NED, and the second electrode may be electrically connected to the second pixel electrode of the light emitting element NED. The auxiliary capacitor Caux may mitigate fluctuations in a voltage of the first pixel electrode (e.g., a voltage of the fourth node N4) of the light emitting element NED due to an operation of the sixth transistor T6, and may enable the light emitting element NED to stably emit light in response to a relatively stable voltage of the first pixel electrode.

The first transistor T1 (or a driving transistor) may include a first electrode connected to a first node N1, a second electrode connected to a second node N2, and a gate electrode connected to a third node N3. The first transistor T1 may provide a driving current Id to the light emitting element NED based on a voltage of the third node N3 (or a data voltage stored in the capacitor Cst).

The second transistor T2 (or a switching transistor) may include a first electrode receiving the data signal Data, a second electrode connected to the first node N1, and a gate electrode receiving the first scan signal GW. The second transistor T2 may be turned on in response to the first scan signal GW, and may transmit the data signal Data to the first node N1.

The third transistor T3 may include a first electrode connected to the second node N2, a second electrode connected to the third node N3, and a gate electrode receiving the first scan signal GW. The third transistor T3 may be turned on in response to the first scan signal GW, and may diode-connect the second electrode of the first transistor T1 and the gate electrode of the first transistor T1.

The capacitor Cst may be connected between the third node N3 and the first power voltage QVDD. The capacitor Cst may store or maintain the data signal Data.

The fourth transistor T4 may include a first electrode receiving the initialization voltage VINT, a second electrode connected to the third node N3, and a gate electrode receiving the second scan signal GI. The fourth transistor T4 may be turned on in response to the second scan signal GI before the data signal Data is stored in the capacitor Cst (or after the light emitting element NED emits light), and may initialize the third node N3 (or the capacitor Cst) with the initialization voltage VINT.

In an embodiment, each of the third transistor T3 and the fourth transistor T4 may be implemented as a dual transistor (i.e., a transistor in which two transistors are combined). In such an embodiment, a leakage current of each of the third transistor T3 and the fourth transistor T4 and a decrease in display quality due to the leakage current may be reduced or substantially prevented.

The fifth transistor T5 and the sixth transistor T6 may be connected between the first power voltage QVDD and the light emitting element NED, and may form a current path through which the driving current Id generated by the first transistor T1 flows.

The fifth transistor T5 may include a first electrode receiving the first power voltage QVDD, a second electrode connected to the first node N1, and a gate electrode receiving the emission control signal EM. The sixth transistor T6 may include a first electrode connected to the second node N2, a second electrode connected to the fourth node N4, and a gate electrode receiving the emission control signal EM.

Each of the fifth and sixth transistors T5 and T6 may be turned on in response to the emission control signal EM. In this case, the driving current Id may be provided to the light emitting element NED, and the light emitting element NED may emit light having a luminance corresponding to the driving current Id.

The seventh transistor T7 may include a first electrode receiving the initialization voltage VINT, a second electrode connected to the fourth node N4, and a gate electrode receiving the third scan signal GB. The seventh transistor T7 may be turned on in response to the third scan signal GB before the light emitting element NED emits light (or after the light emitting element NED emits light), and may initialize the first pixel electrode of the light emitting element NED with the initialization voltage VINT. The auxiliary capacitor Caux connected in parallel to the light emitting element NED and a parasitic capacitor of the light emitting element NED may be charged or discharged by the driving current Id while the light emitting element NED emits light, such that the first pixel electrode of the light emitting element NED may have a voltage that is not constant. Accordingly, the parasitic capacitor of the light emitting element NED and the auxiliary capacitor Caux may be initialized through the seventh transistor T7.

FIG. 3 illustrates that the seventh transistor T7 receives the third scan signal GB; however, the present invention is not limited thereto, and the seventh transistor T7 may receive, for example, the second scan signal GI.

Figure 4:
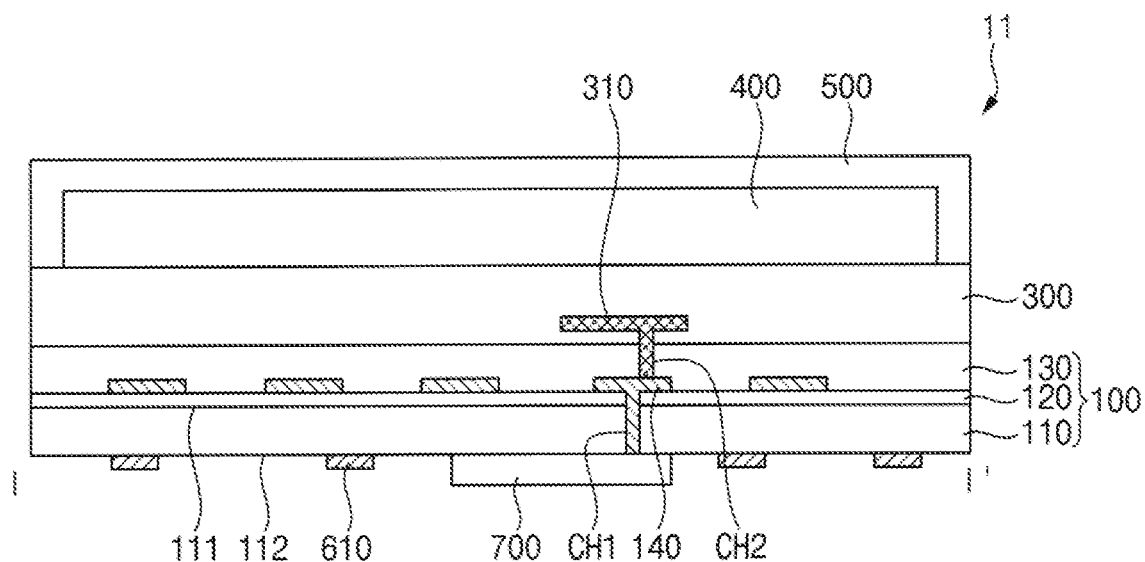
FIG. 4 is a cross-sectional view illustrating an example of the display panel taken along a line I-I' in FIG. 1.
Figure 5:
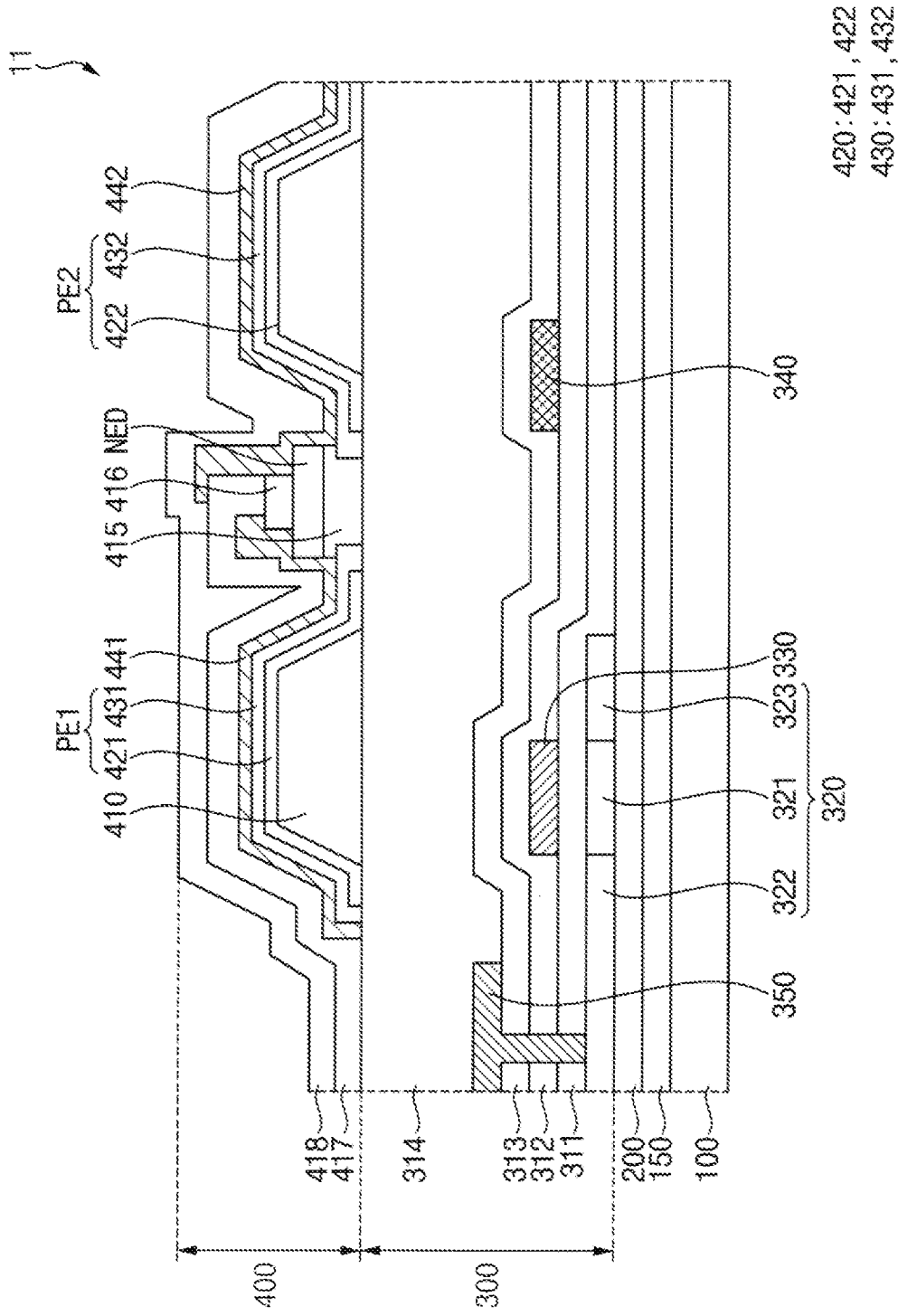
FIG. 5 is a cross-sectional view illustrating a portion of the display panel in FIG. 4.

FIG. 4 is a cross-sectional view illustrating an example of the display panel 11 taken along a line I-I' in FIG. 1; and FIG. 5 is a cross-sectional view illustrating a portion of the display panel 11 in FIG. 4.

Referring to FIGS. 1, 4, and 5, the display panel 11 may include a substrate 100, a wiring 140, a second barrier layer 150, a buffer layer 200, a circuit layer 300, an emission layer 400, an encapsulation layer 500, a residual pattern 610, and a driving element 700.

In an embodiment, the substrate 100 may include a first substrate layer 110, a first barrier layer 120, and a second substrate layer 130. In an embodiment, the first substrate layer 110 may include an organic insulation material. For example, the organic insulation material may include polyethersulfone (PES), polyacrylate (PAR), polyetherimide (PEI), polyethylene naphthalate (PEN), polyethylene terephthalate (PET), polyphenylene sulfide (PPS), polyimide (PI), polycarbonate (PC), cellulose acetate propionate (CAP), or the like.

The first barrier layer 120 may be disposed on the first substrate layer 110. In an embodiment, the first barrier layer 120 may include an inorganic insulation material, such as silicon oxide, silicon nitride, silicon oxynitride, or the like.

The second substrate layer 130 may be disposed on the first barrier layer 120. The second substrate layer 130 may include an organic insulation material. In an embodiment, the second substrate layer 130 may include substantially the same material as the first substrate layer 110.

The wiring 140 may be disposed on an upper surface 111 of the first substrate layer 110. In an embodiment, the wiring 140 may be disposed between the first barrier layer 120 and the second substrate layer 130. In such an embodiment, the second substrate layer 130 may cover the wiring 140. The wiring 140 may include a conductive material, such as a metal or the like.

A first through-hole CH1 is formed in the first substrate layer 110, and the wiring 140 may extend into the first through-hole CH1. The wiring 140 may extend from an upper surface of the first barrier layer 120 toward a lower surface 112 of the first substrate layer 110 along the first through-hole CH1. In an embodiment, the wiring 140 may have a structure that covers only a surface of the first substrate layer 110 exposed by the first through-hole CH1.

The second barrier layer 150 may be disposed on the second substrate layer 130. In an embodiment, the second barrier layer 150 may include an inorganic insulation material, such as silicon oxide, silicon nitride, silicon oxynitride, or the like.

The buffer layer 200 may be disposed on the second barrier layer 150. The buffer layer 200 may planarize an upper surface of the substrate 100, and/or may prevent or substantially prevent impurities from penetrating from under the substrate 100. In an embodiment, the buffer layer 200 may include an inorganic insulation material, such as silicon oxide, silicon nitride, silicon oxynitride, or the like.

The circuit layer 300 may be disposed on the buffer layer 200. In an embodiment, the circuit layer 300 may include a pad 310, a semiconductor layer 320, a first insulation layer 311, a scan line 330, a second insulation layer 312, an initialization voltage line 340, a third insulation layer 313, a data line 350, and a fourth insulation layer 314.

The pad 310 may be electrically connected to the wiring 140. In an embodiment, the pad 310 may contact the wiring 140 through a second through-hole CH2 formed in the second substrate layer 130. The pad 310 may include a conductive material, such as a metal or the like.

The semiconductor layer 320 may include a channel region 321, a source region 322, and a drain region 323. The source region 322 and the drain region 323 may be disposed on opposite sides of the channel region 321, respectively.

In an embodiment, the semiconductor layer 320 may include polycrystalline silicon. However, the present invention is not limited thereto, and, in other embodiments, the semiconductor layer 320 may include single crystal silicon, amorphous silicon, an oxide semiconductor, or the like.

The first insulation layer 311 may be disposed on the semiconductor layer 320. The first insulation layer 311 may cover the semiconductor layer 320 on the buffer layer 200. In an embodiment, the first insulation layer 311 may include an inorganic insulation material, such as silicon oxide, silicon nitride, silicon oxynitride, or the like.

The scan line 330 may be disposed on the first insulation layer 311. The scan line 330 may include a metal, such as molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu), or the like. In an embodiment, the semiconductor layer 320 and the scan line 330 may form the second transistor T2 in FIG. 3.

The second insulation layer 312 may be disposed on the scan line 330. The second insulation layer 312 may cover the scan line 330 on the first insulation layer 311. In an embodiment, the second insulation layer 312 may include an inorganic insulation material, such as silicon oxide, silicon nitride, silicon oxynitride, or the like.

The initialization voltage line 340 may be disposed on the second insulation layer 312. The initialization voltage line 340 may include a metal, such as molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu), or the like.

The third insulation layer 313 may be disposed on the initialization voltage line 340. The third insulation layer 313 may cover the initialization voltage line 340 on the second insulation layer 312. In an embodiment, the third insulation layer 313 may include an inorganic insulation material, such as silicon oxide, silicon nitride, silicon oxynitride, or the like.

The data line 350 may be disposed on the third insulation layer 313. The data line 350 may include a metal, such as molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu), or the like.

In an embodiment, the pad 310 may be disposed on the same layer as one of the scan line 330, the initialization voltage line 340, and the data line 350. In other words, the pad 310 may be disposed between the first insulation layer 311 and the second insulation layer 312, between the second insulation layer 312 and the third insulation layer 313, or between the third insulation layer 313 and the fourth insulation layer 314. The pad 310 may be connected to at least one of the scan line 330, the initialization voltage line 340, and the data line 350 to provide the scan signals GW, GI, and GB in FIG. 3, the initialization voltage VINT in FIG. 3, and/or the data signal Data in FIG. 3.

The fourth insulation layer 314 may be disposed on the data line 350. The fourth insulation layer 314 may cover the data line 350 on the third insulation layer 313. In an embodiment, the fourth insulation layer 314 may include an organic insulation material, such as polyacrylic resin, polyimide-based resin, or the like. An upper surface of the fourth insulation layer 314 may be substantially flat.

The emission layer 400 may be disposed on the circuit layer 300. The emission layer 400 may include a partition wall 410, a reflective layer 420, an electrode layer 430, a fifth insulation layer 415, a light emitting element NED, a sixth insulation layer 416, a first contact electrode 441, a seventh insulation layer 417, a second contact electrode 442, and an eighth insulation layer 418.

The partition wall 410 may be disposed on the fourth insulation layer 314. In an embodiment, the partition wall 410 may have a tapered cross-sectional shape. In other words, a side surface of the partition wall 410 may be formed to be inclined, and may form an acute angle with the upper surface of the fourth insulation layer 314. In this case, light emitted from a side surface of the light emitting element NED may be substantially reflected upward by the reflective layer 420 corresponding to the side surface of the partition wall 410. In an embodiment, the partition wall 410 may include an organic insulation material, such as polyacrylic resin, polyimide-based resin, or the like.

The reflective layer 420 may be disposed on the partition wall 410. The reflective layer 420 may cover the partition wall 410 on the fourth insulation layer 314. The reflective layer 420 may include a first reflective pattern 421 and a second reflective pattern 422.

The reflective layer 420 may include a reflective material (or a material having a high reflectivity) having reflective properties that reflect light. For example, the reflective material may include at least one of silver (Ag), magnesium (Mg), chromium (Cr), gold (Au), platinum (Pt), nickel (Ni), copper (Cu), tungsten (W), aluminum (Al), aluminum-lithium (Al—Li), magnesium-indium (Mg—In), and magnesium-silver (Mg—Ag).

The electrode layer 430 may be disposed on the reflective layer 420. The electrode layer 430 may cover the reflective layer 420. The electrode layer 430 may include a first pixel electrode pattern 431 and a second pixel electrode pattern 432. The first pixel electrode pattern 431 may cover the first reflective pattern 421 on the fourth insulation layer 314. The second pixel electrode pattern 432 may cover the second reflective pattern 422 on the fourth insulation layer 314.

The electrode layer 430 may have a relatively excellent electrical conductivity. The electrode layer 430 may transmit an electric signal transmitted from the circuit layer to the first and second contact electrodes 441 and 442. The electrode layer 430 may include a transparent conductive material. For example, the electrode layer 430 may include a material such as indium tin oxide (ITO), indium zinc oxide (IZO), indium tin zinc oxide (ITZO), or the like.

The first reflective pattern 421 and the first pixel electrode pattern 431 may form a first pixel electrode PE1, and the second reflective pattern 422 and the second pixel electrode pattern 432 may form a second pixel electrode PE2.

The fifth insulation layer 415 may be disposed on a portion of the first pixel electrode PE1 and a portion of the second pixel electrode PE2. The fifth insulation layer may be disposed between the first pixel electrode PE1 and the second pixel electrode PE2 on the fourth insulation layer 314. The fifth insulation layer 415 may insulate the first pixel electrode PE1 and the second pixel electrode PE2.

The light emitting element NED may be disposed on the fifth insulation layer 415. The light emitting element NED may be disposed between the first pixel electrode PE1 and the second pixel electrode PE2. The first pixel electrode PE1 and the second pixel electrode PE2 may be spaced apart by an interval (e.g., a predetermined interval), and the interval between the first pixel electrode PE1 and the second pixel electrode PE2 may be substantially equal to or less than a length of the light emitting element NED.

The light emitting element NED may be a light emitting diode. In an embodiment, the light emitting element NED may be a nanostructure having a size of a nano unit. In an embodiment, the light emitting element NED may be an inorganic light emitting diode. In such an embodiment, when a light emitting material having an inorganic crystal structure is disposed between two electrodes facing each other and an electric field is formed in the light emitting material in a specific direction, the inorganic light emitting diode may be aligned between the electrodes having a specific polarity. However, the present invention is not limited thereto, and, in another embodiment, the light emitting element NED may be an organic light emitting diode.

Figure 6:
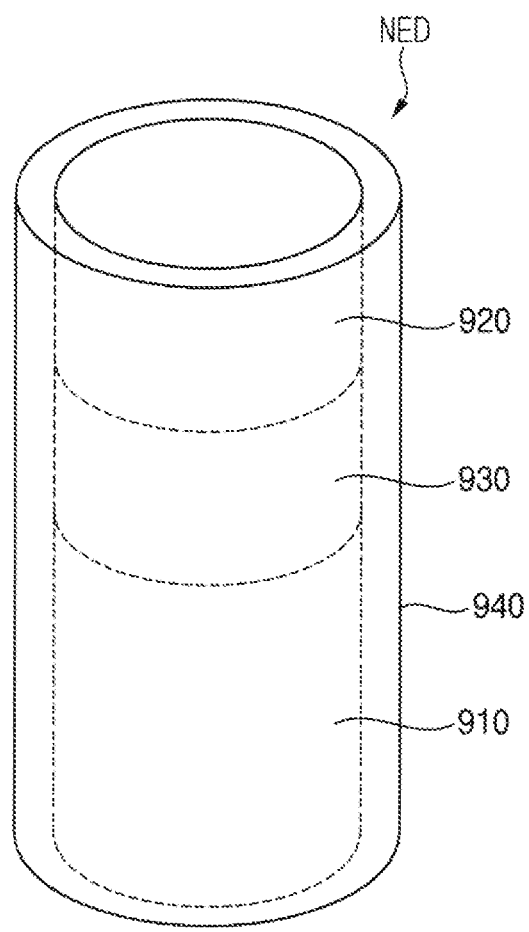
FIG. 6 is a diagram illustrating a light emitting element in FIG. 5.

FIG. 6 is a diagram illustrating the light emitting element NED in FIG. 5, according to an embodiment.

Referring to FIGS. 5 and 6, the light emitting element NED may include a first semiconductor layer 910, a second semiconductor layer 920, an active material layer 930, and an insulation material layer 940. Electrical signals applied from the first and second pixel electrodes PE1 and PE2 may be transmitted to the active material layer through the first and second semiconductor layers 910 and 920, such that light may be emitted from the light emitting element NED.

In an embodiment, the first semiconductor layer 910 may include an n-type semiconductor. For example, the n-type semiconductor may be at least one of InAlGaN, GaN, AlGaN, InGaN, AlN, and InN, doped with n-type impurities. The first semiconductor layer 910 may be doped with a first conductive dopant. For example, the first conductive dopant may be Si, Ge, Sn, or the like.

In an embodiment, the second semiconductor layer 920 may include a p-type semiconductor. For example, the p-type semiconductor may be at least one of InAlGaN, GaN, AlGaN, InGaN, AlN, and InN, doped with p-type impurities. The second semiconductor layer 920 may be doped with a second conductive dopant. For example, the second conductive dopant may be Mg, Zn, Ca, Se, Ba, or the like.

The active material layer 930 may be disposed between the first semiconductor layer 910 and the second semiconductor layer 920. The active material layer 930 may include a material having a single or multiple quantum well structure. In an embodiment, the active material layer 930 may have a structure in which a semiconductor material having a high band gap energy and a semiconductor material having a low band gap energy are alternately stacked with each other. The active material layer 930 may emit light by combining an electron-hole pair according to an electric signal applied through the first semiconductor layer 910 and the second semiconductor layer 920.

The insulation material layer 940 may be formed on an outside of the light emitting element NED to protect the light emitting element NED. In an embodiment, the insulation material layer 940 may be formed to surround a side of the light emitting element NED, and may not be formed on opposite ends of the light emitting element NED in a longitudinal direction, for example, on opposite ends on which the first semiconductor layer 910 and the second semiconductor layer 920 are disposed. The insulation material layer 940 may prevent or substantially prevent an electrical short that may occur when the active material layer 930 directly contacts the first pixel electrode PE1 or the second pixel electrode PE2.

In an embodiment, the light emitting element NED may have a cylindrical shape. However, the shape of the light emitting element NED is not limited thereto, and, in another embodiment, the light emitting element NED may have any of various shapes, such as a cube shape, a rectangular parallelepiped shape, a hexagonal column shape, or the like.

Referring to FIGS. 1, 4, and 5 again, the sixth insulation layer 416 may be disposed on the light emitting element NED. The sixth insulation layer 416 may protect the light emitting element NED, and may fix the light emitting element NED between the first pixel electrode PE1 and the second pixel electrode PE2.

The first contact electrode 441 and the second contact electrode 442 may be disposed on the sixth insulation layer 416. The first contact electrode 441 may be disposed on the first pixel electrode PE1, and may overlap at least a portion of the sixth insulation layer 416. The second contact electrode 442 may be disposed on the second pixel electrode PE2, may be spaced apart from the first contact electrode 441, and may overlap at least a portion of the sixth insulation layer 416.

The first contact electrode 441 and the second contact electrode 442 may contact the first pixel electrode pattern 431 and the second pixel electrode pattern 432, respectively. The first contact electrode 441 and the second contact electrode 442 may also contact the first semiconductor layer 910 and the second semiconductor layer 920 of the light emitting element NED, respectively. Accordingly, the first contact electrode and the second contact electrode 442 may transmit electric signals applied to the first pixel electrode PE1 and the second pixel electrode PE2 to the light emitting element NED.

The first contact electrode 441 may cover the first pixel electrode PE1, and may partially contact the light emitting element NED and the sixth insulation layer 416. The second contact electrode 442 may cover the second pixel electrode PE2, and partially contact the light emitting element NED, the sixth insulation layer 416, and the seventh insulation layer 417.

The first contact electrode 441 and the second contact electrode 442 may be spaced apart from each other on the sixth insulation layer 416 or the seventh insulation layer 417. The first contact electrode 441 and the second contact electrode 442 may include a conductive material. For example, the conductive material may include ITO, IZO, ITZO, aluminum (Al), or the like.

The seventh insulation layer 417 may be disposed on the first contact electrode 441. In an embodiment, the seventh insulation layer 417 may entirely cover the first contact electrode 441 on the sixth insulation layer 416. Accordingly, the seventh insulation layer 417 may protect the first contact electrode 441, and may insulate the second contact electrode 442 from the first contact electrode 441.

The eighth insulation layer 418 may be disposed on the seventh insulation layer 417 and the second contact electrode 442. The eighth insulation layer 418 may protect the first pixel electrode PE1, the second pixel electrode PE2, and the light emitting element NED from the outside.

The encapsulation layer 500 may be disposed on the emission layer 400. The encapsulation layer 500 may cover the emission layer 400 on the circuit layer 300. The encapsulation layer 500 may protect the emission layer 400 from impurities, such as oxygen, moisture, etc. from the outside. In an embodiment, the encapsulation layer 500 may include at least one inorganic encapsulation layer and at least one organic encapsulation layer. The inorganic encapsulation layer and the organic encapsulation layer may be alternately disposed on the emission layer 400.

The residual pattern 610 may be disposed on the lower surface 112 of the first substrate layer 110. The residual pattern 610 may contact the lower surface 112 of the first substrate layer 110.

As described below, in a process of separating a sacrificial layer 600 in FIG. and a carrier glass 800 in FIG. 13 from the first substrate layer 110, a portion of the sacrificial layer 600 may remain thereby forming the residual pattern 610 on the lower surface 112 of the first substrate layer 110. Accordingly, the residual pattern 610 may be irregularly disposed on the lower surface 112 of the first substrate layer 110 in a plan view.

The residual pattern 610 may include a material having a high absorption rate with respect to a laser and a relatively low melting point, such that an adhesion of the residual pattern 610 may decrease by the laser. In an embodiment, the residual pattern may include at least one of titanium (Ti), molybdenum (Mo), and molybdenum oxide ($MoO_2$).

In an embodiment, an absorption rate of the residual pattern 610 with respect to the laser may be about 25% or more. The absorption rate of the residual pattern 610 with respect to the laser will be described further below.

In an embodiment, a melting point of the residual pattern 610 may be about 3,000 degrees Celsius or less. The melting point of the residual pattern 610 will be described further below.

The driving element 700 may be disposed on the lower surface 112 of the first substrate layer 110. The driving element 700 may be electrically connected to the wiring 140. The driving element 700 may directly contact the wiring 140 that extends into the first through-hole CH1 formed in the first substrate layer 110, or may be connected to the wiring 140 through an anisotropic conductive film (ACF) or the like.

In an embodiment, the driving element 700 may include at least one of a flexible printed circuit board and an integrated circuit chip. The driving element 700 may include the scan driver SD in FIG. 2, the data driver DD in FIG. 2, the emission control driver ED in FIG. 2, and/or the timing controller TC in FIG. 2.

In the display panel 11 according to embodiments, the driving element 700 may be disposed on a lower surface of the substrate 100, and may be connected to the pad 310 through the wiring 140 disposed in the substrate 100, such that a dead space of the display panel 11 may be reduced. Further, the display device 10 according to embodiments may include the display panels 11 to 19 having the reduced dead space, such that a non-display area between the display panels 11 to 19 may be reduced. Accordingly, the display device 10 may provide a relatively large screen.

FIGS. 7 to 14 are cross-sectional views illustrating a method of manufacturing a display panel according to an embodiment. For example, FIGS. 7 to 14 may illustrate a method of manufacturing the display panel 11 in FIG. 4.

Figure 7:
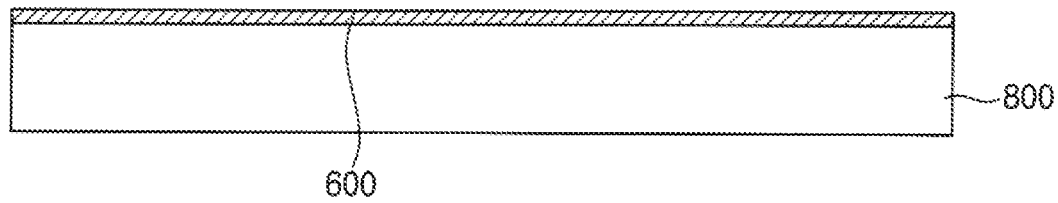
FIGS. 7 to 14 are cross-sectional views illustrating a method of manufacturing a display panel according to an embodiment.

Referring to FIG. 7, a sacrificial layer 600 may be formed on a carrier glass 800. The carrier glass 800 may support a display panel in a process of forming the display panel.

The sacrificial layer 600 may be formed of a material that has a high absorption rate with respect to a laser and a relatively low melting point, such that an adhesion of the sacrificial layer 600 may decrease by the laser. In an embodiment, the sacrificial layer 600 may include at least one of titanium (Ti), molybdenum (Mo), and molybdenum oxide ($MoO_2$).

In an embodiment, an absorption rate of the sacrificial layer 600 with respect to the laser may be about 25% or more. When the absorption rate of the sacrificial layer with respect to the laser is less than about 25%, the sacrificial layer 600 may not sufficiently absorb the laser. In this case, as described below, in a process of separating the sacrificial layer 600 and the carrier glass 800 from a first substrate layer 110, the sacrificial layer 600 may not be easily separated from the first substrate layer 110.

In an embodiment, a melting point of the sacrificial layer 600 may be about 3,000 degrees Celsius or less. When the melting point of the sacrificial layer 600 is greater than about 3,000 degrees Celsius, a state of the sacrificial layer 600 may not be changed from a solid state to a liquid state by the laser. In this case, in the process of separating the sacrificial layer 600 and the carrier glass 800 from the first substrate layer 110, the sacrificial layer 600 may not be easily separated from the first substrate layer 110.

In an embodiment, a thickness of the sacrificial layer 600 may be about 300 Å or more and about 1,000 Å or less. When the thickness of the sacrificial layer 600 is less than about 300 Å, as described below, the sacrificial layer 600 may be penetrated in the process of forming a first through-hole CH1 in the first substrate layer 110. When the thickness of the sacrificial layer 600 is greater than about 1,000 Å, the sacrificial layer may not sufficiently absorb the laser. In this case, in the process of separating the sacrificial layer 600 and the carrier glass 800 from the first substrate layer 110, the sacrificial layer 600 may not be easily separated from the first substrate layer 110.

Figure 8:
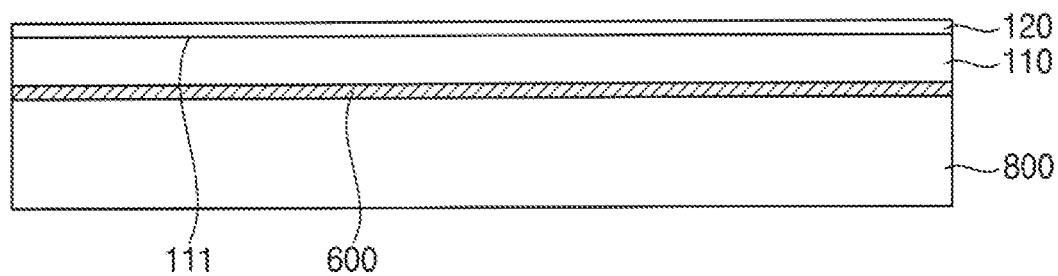

Referring to FIG. 8, the first substrate layer 110 and a first barrier layer 120 may be formed on the sacrificial layer 600. In an embodiment, first, the first substrate layer 110 may be formed on the sacrificial layer 600 by using an organic insulation material, and, then, the first barrier layer 120 may be formed on the first substrate layer by using an inorganic insulation material.

Figure 9:
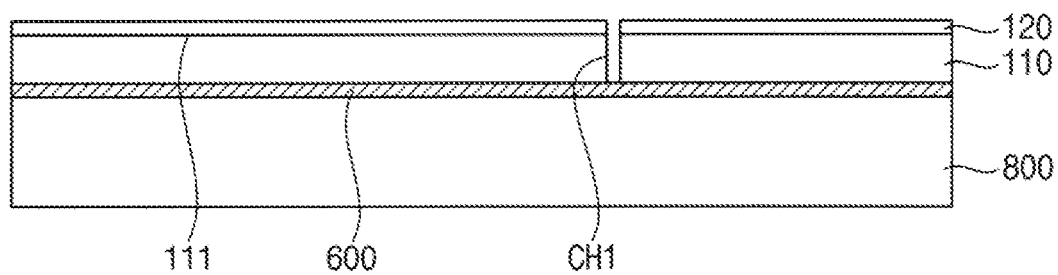

Referring to FIG. 9, the first through-hole CH1 may be formed in the first substrate layer 110 and the first barrier layer 120. When the thickness of the sacrificial layer 600 is about 300 Å or more, it is possible to prevent or substantially prevent the sacrificial layer 600 from being penetrated in the process of forming the first through-hole CH1.

In an embodiment, the first through-hole CH1 may be formed by an etching process. For example, the first through-hole CH1 may be formed by a dry etching process. However, the present invention is not limited thereto, and in another embodiment, for example, the first through-hole CH1 may be formed by laser drilling.

Figure 10:
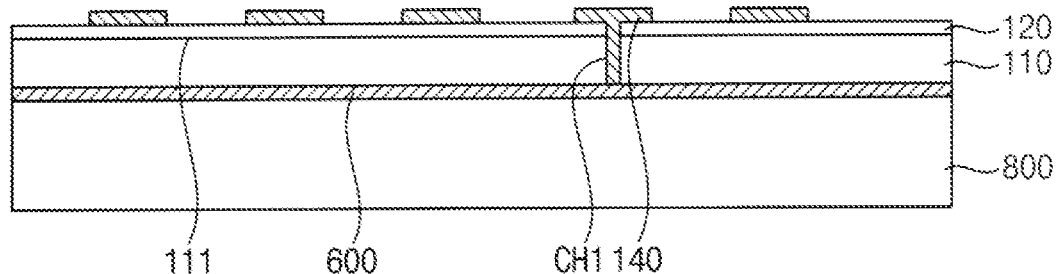

Referring to FIG. 10, a wiring 140 may be formed on an upper surface 111 of the first substrate layer 110. The wiring 140 may be formed on the first barrier layer 120 by using a conductive material. The wiring 140 may extend into the first through-hole CH1 formed in the first substrate layer 110.

Figure 11:
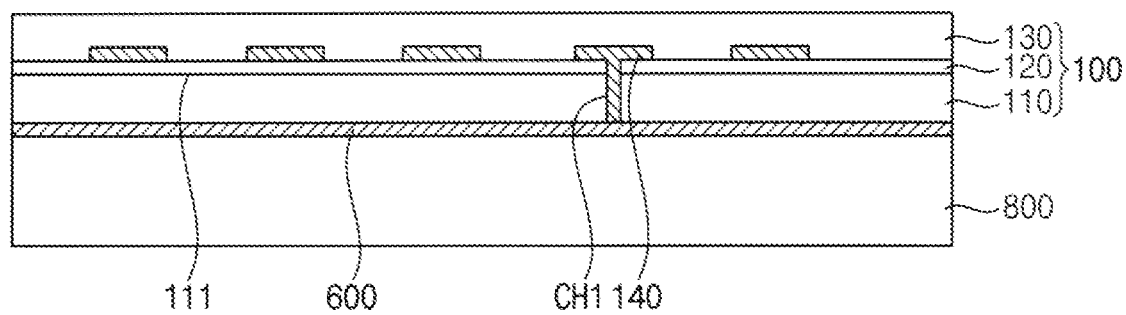

Referring to FIG. 11, a second substrate layer 130 may be formed on the wiring 140. In an embodiment, the second substrate layer 130 covering the wiring 140 may be formed on the first barrier layer 120 by using an organic insulation material. In an embodiment, the second substrate layer 130 may be formed using substantially the same material as the first substrate layer 110. The first substrate layer 110, the first barrier layer 120, and the second substrate layer 130 may form a substrate 100.

Figure 12:
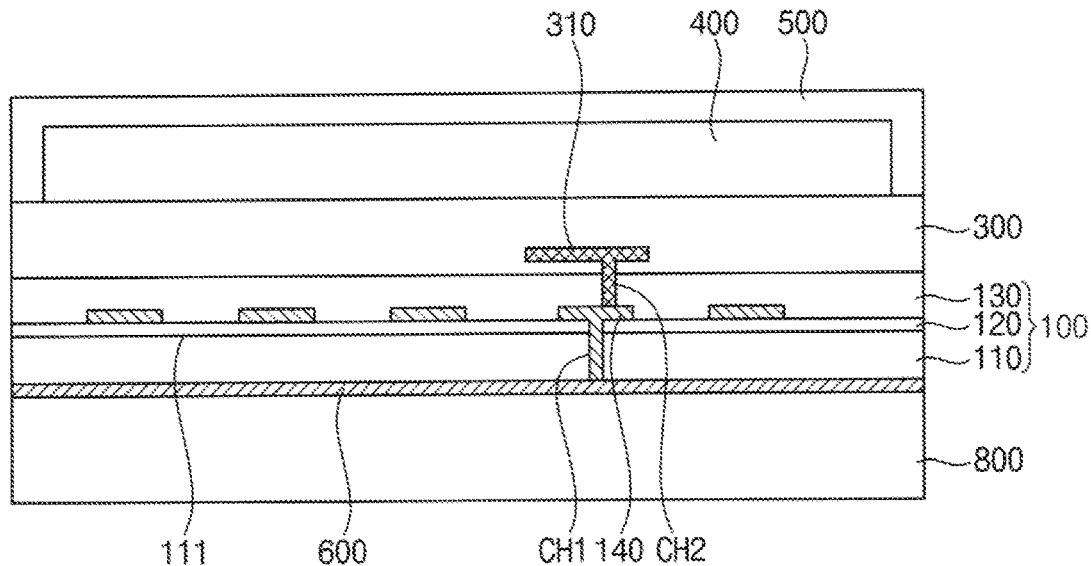

Referring to FIG. 12, a circuit layer 300, an emission layer 400, and an encapsulation layer 500 may be sequentially formed on the substrate 100.

The circuit layer 300 may include a pad 310. The pad 310 may contact the wiring 140 through a second through-hole CH2 formed in the second substrate layer 130. In an embodiment, the pad 310 may be formed substantially concurrently (e.g., substantially simultaneously) with one of the scan line 330 in FIG. 5, the initialization voltage line 340 in FIG. 5, and the data line 350 in FIG. 5 of the circuit layer 300.

Figure 13:
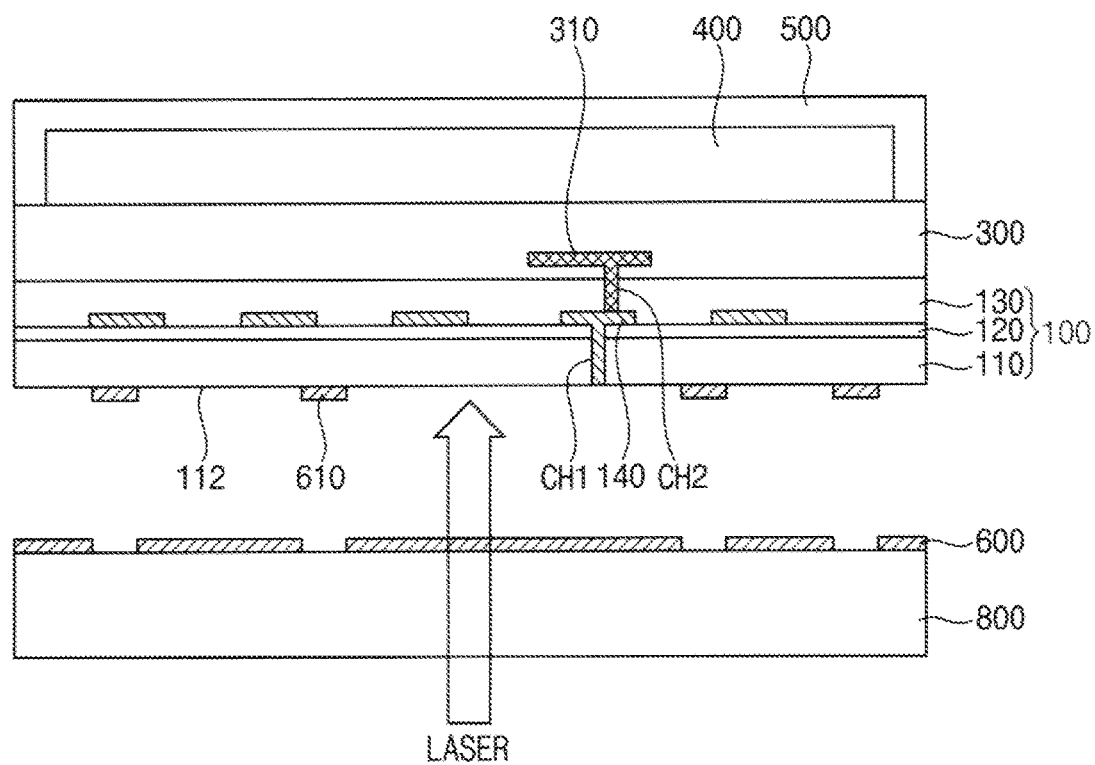

Referring to FIG. 13, the sacrificial layer 600 and the carrier glass 800 may be separated from the first substrate layer 110 by irradiating the sacrificial layer 600 with a laser. In an embodiment, the laser may be emitted from under the carrier glass 800.

When the sacrificial layer 600 is irradiated with the laser, the sacrificial layer may change from a solid state to a liquid state, and, accordingly, the adhesion of the sacrificial layer 600 may decrease. Accordingly, the sacrificial layer 600 and the carrier glass 800 may be easily separated from the first substrate layer 110. In the process of separating the sacrificial layer 600 from the first substrate layer 110, a portion of the sacrificial layer 600 may remain on a lower surface 112 of the first substrate layer 110 to form a residual pattern 610.

Figure 14:
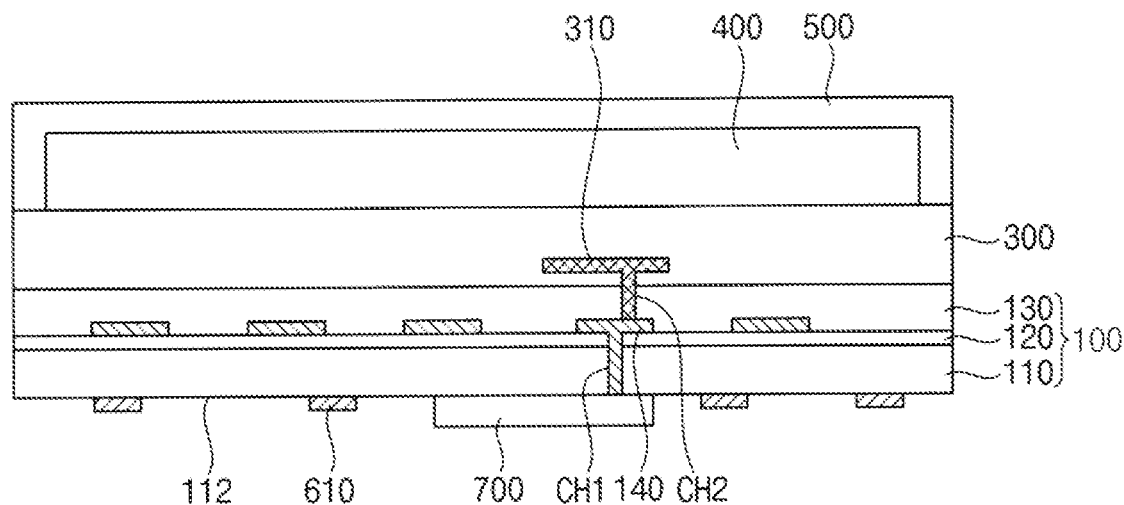

Referring to FIG. 14, a driving element 700 may be attached to the lower surface 112 of the first substrate layer 110. The driving element 700 may be electrically connected to the wiring 140.

In a method of manufacturing a display panel according to the prior art, a first through-hole penetrating a first substrate layer is formed after attaching a protective glass on an encapsulation layer, and a carrier glass may be separated from the first substrate layer. In this case, as the protective glass is additionally required, a manufacturing cost of the display panel may be increased, and static electricity may be generated in the process of separating the protective glass from the encapsulation layer, thereby damaging the display panel.

However, in the method of manufacturing the display panel 11 according to embodiments of the present disclosure, the circuit layer 300, the emission layer 400, and the encapsulation layer 500 may be sequentially formed after forming the first through-hole CH1 penetrating the first substrate layer 110, and the sacrificial layer 600 may be irradiated with the laser to separate the carrier glass 800 from the first substrate layer 110, such that a protective glass used for the formation of the first through-hole CH1 and the separation of the carrier glass 800 may not be required. Accordingly, a manufacturing cost of the display panel 11 may be decreased, and the generation of static electricity in a process of separating a protective glass from the encapsulation layer 500 may be prevented.

Figure 15:
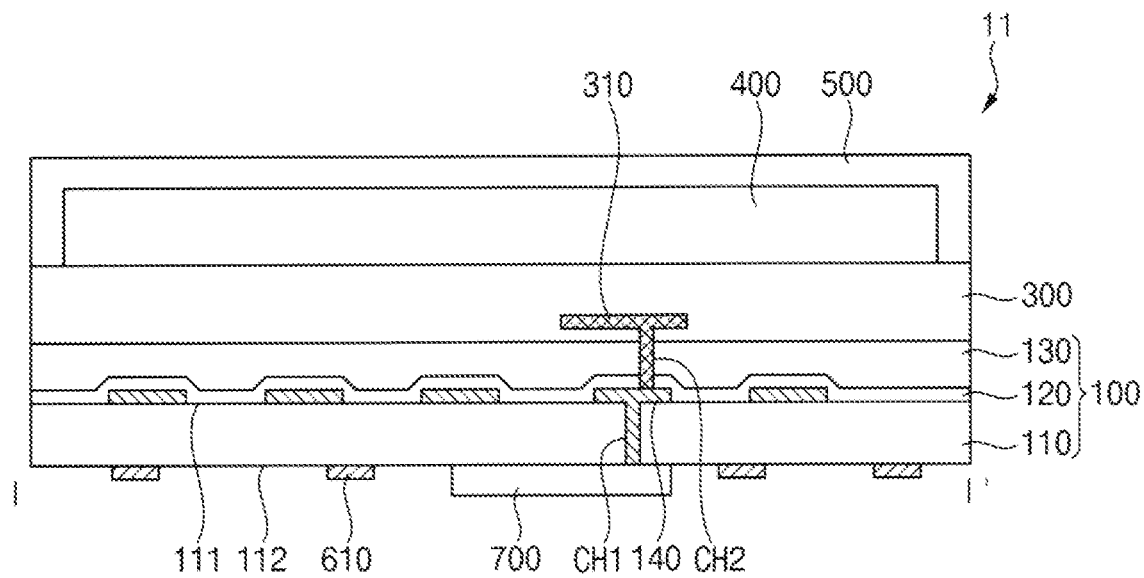
FIG. 15 is a cross-sectional view illustrating another example of the display panel taken along a line I-I' in FIG. 1.

FIG. 15 is a cross-sectional view illustrating another example of the display panel 11 taken along a line I-I' in FIG. 1.

Referring to FIG. 15, a display panel 11 may include a substrate 100, a wiring 140, a circuit layer 300, an emission layer 400, an encapsulation layer 500, a residual pattern 610, and a driving element 700. The display panel described with reference to FIG. 15 may be substantially the same as or similar to the display panel described with reference to FIGS. 4 and 5 except for the position of the wiring 140. Accordingly, descriptions of repeated elements may be omitted.

In an embodiment, the wiring 140 may be disposed between the first substrate layer 110 and the first barrier layer 120. In such an embodiment, the first barrier layer may cover the wiring 140. The pad 310 may contact the wiring 140 through a second through-hole CH2 formed in the first barrier layer 120 and the second substrate layer 130.

Figure 16:
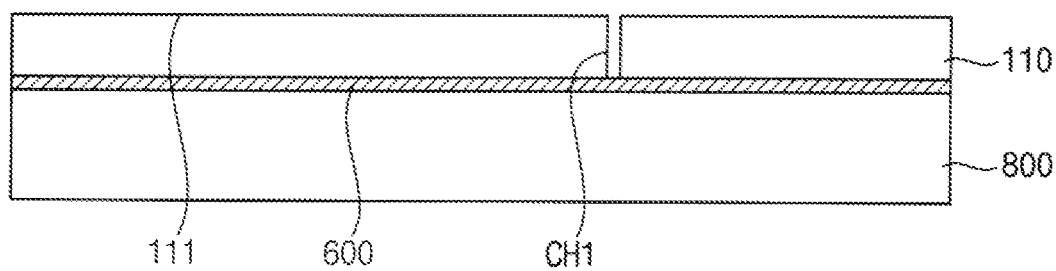
FIGS. 16 to 18 are cross-sectional views illustrating a method of manufacturing a display panel according to an embodiment.
Figure 17:
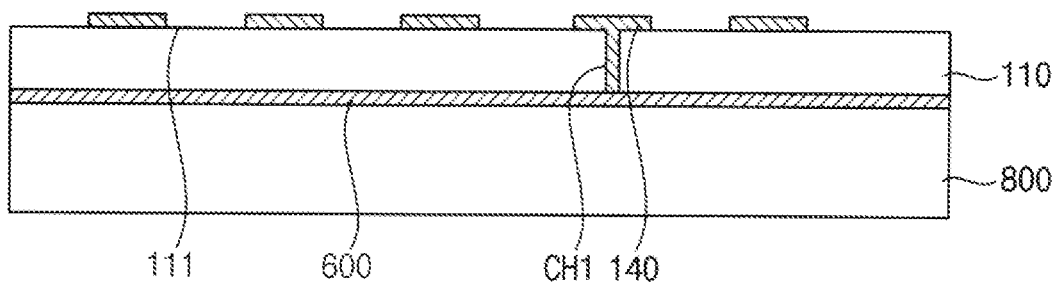
Figure 18:
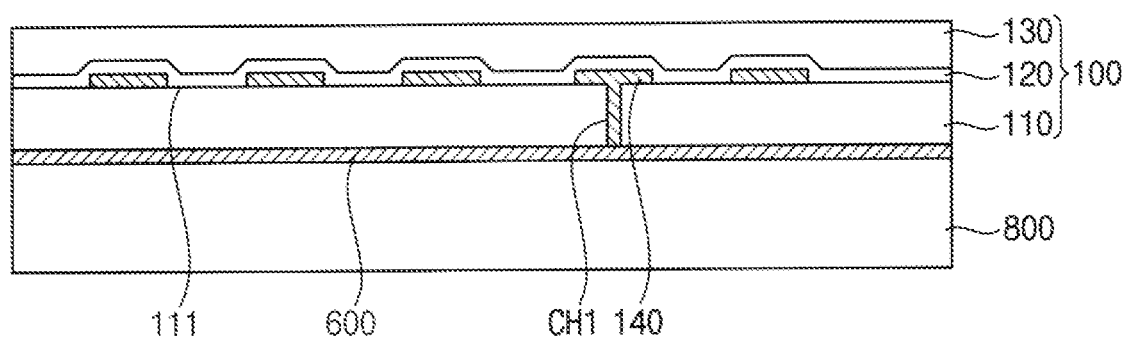

FIGS. 16 to 18 are cross-sectional views illustrating a method of manufacturing a display panel according to an embodiment. For example, FIGS. 16 to 18 may illustrate a method of manufacturing the display panel 11 in FIG. 15.

The method of manufacturing the display panel described with reference to FIGS. 16 to 18 may be substantially the same as or similar to the method of manufacturing the display panel described with reference to FIGS. 7 to 14 except for the position of the wiring 140. Accordingly, descriptions of repeated elements may be omitted.

Referring to FIG. 16, first, a first substrate layer 110 may be formed on a sacrificial layer 600. Then, a first through-hole CH1 may be formed in the first substrate layer 110.

Referring to FIG. 17, a wiring 140 may be formed on an upper surface 111 of the first substrate layer 110. The wiring 140 may be formed on the first substrate layer by using a conductive material. The wiring 140 may extend into the first through-hole CH1 formed in the first substrate layer 110.

Referring to FIG. 18, a first barrier layer 120 and a second substrate layer 130 may be sequentially formed on the wiring 140. In an embodiment, the first barrier layer covering the wiring 140 may be formed on the first substrate layer 110 by using an inorganic insulation material, and the second substrate layer 130 may be formed on the first barrier layer 120 by using an organic insulation material.

The display device according to the embodiments may be applied to a display device included in a computer, a notebook, a mobile phone, a smartphone, a smart pad, a PMP, a PDA, an MP3 player, or the like.

Although display devices and methods of manufacturing a display device according to some embodiments have been described with reference to the drawings, the illustrated embodiments are examples, and may be modified and changed by a person having ordinary knowledge in the relevant technical field without departing from the technical spirit described in the following claims.

What is claimed is:

1. A method of manufacturing a display device, the method comprising:
   forming a sacrificial layer on a carrier glass;
   forming a first substrate layer on the sacrificial layer, the first substrate layer comprising an organic insulation material;
   forming a first through-hole in the first substrate layer, the first through-hole passing through the first substrate layer;
   forming a wiring on an upper surface of the first substrate layer, the wiring extending into the first through-hole;
   sequentially forming a circuit layer, an emission layer, and an encapsulation layer on the wiring;
   separating the sacrificial layer and the carrier glass from the first substrate layer by irradiating the sacrificial layer with a laser so as to change a state of the sacrificial layer from a solid state to a liquid state; and
   attaching a driving element on a lower surface of the first substrate layer, the driving element being electrically connected to the wiring through the first through-hole.

2. The method of claim 1, wherein the sacrificial layer comprises at least one of titanium, molybdenum, and molybdenum oxide.

3. The method of claim 1, wherein an absorption rate of the sacrificial layer with respect to the laser is about 25% or more.

4. The method of claim 1, wherein a melting point of the sacrificial layer is about 3,000 degrees Celsius or less.

5. The method of claim 1, wherein a thickness of the sacrificial layer is about 300 Å or more and about 1,000 Å or less.

6. The method of claim 1, wherein the first through-hole is formed by an etching process.

7. The method of claim 1, further comprising:
after forming the first substrate layer and before forming the first through-hole, forming a barrier layer on the first substrate layer, the barrier layer comprising an inorganic insulation material.

8. The method of claim 1, wherein the laser is emitted under the carrier glass.

9. A method of manufacturing a display device, the method comprising:
forming a sacrificial layer on a carrier glass;
forming a first substrate layer on the sacrificial layer, the first substrate layer comprising an organic insulation material;
forming a first through-hole in the first substrate layer, the first through-hole passing through the first substrate layer;
forming a wiring on an upper surface of the first substrate layer, the wiring extending into the first through-hole;
sequentially forming a circuit layer, an emission layer, and an encapsulation layer on the wiring;
after forming the wiring and before sequentially forming the circuit layer, the emission layer, and the encapsulation layer, forming a second substrate layer on the first substrate layer, the second substrate layer covering the wiring;
separating the sacrificial layer and the carrier glass from the first substrate layer by irradiating the sacrificial layer with a laser; and
attaching a driving element on a lower surface of the first substrate layer, the driving element being electrically connected to the wiring through the first through-hole.

10. The method of claim 9, wherein the circuit layer comprises a pad, and
wherein the pad contacts the wiring through a second through-hole formed in the second substrate layer.

11. The method of claim 9, further comprising:
after forming the wiring and before forming the second substrate layer, forming a barrier layer on the first substrate layer, the barrier layer covering the wiring and comprising an inorganic insulation material.

12. The method of claim 9, wherein the second substrate layer comprises a same material as the first substrate layer.

\* \* \* \* \*